(12) United States Patent
Crozier et al.

(10) Patent No.: US 8,421,463 B2
(45) Date of Patent: Apr. 16, 2013

(54) MAGNETS FOR USE IN MAGNETIC RESONANCE IMAGING

(75) Inventors: Stuart Crozier, Brisbane (AU); Huawei Zhao, Brisbane (AU); Feng Liu, Brisbane (AU)

(73) Assignee: NMR Holdings No. 2 Pty Ltd., Toowong, Queensland (AU)

( * ) Notice: Subject to any disclaimer, the term of this patent is extended or adjusted under 35 U.S.C. 154(b) by 734 days.

(21) Appl. No.: 12/447,070

(22) PCT Filed: Oct. 26, 2007

(86) PCT No.: PCT/AU2007/001647
§ 371 (c)(1),
(2), (4) Date: Nov. 24, 2009

(87) PCT Pub. No.: WO2008/049174
PCT Pub. Date: May 2, 2008

(65) Prior Publication Data
US 2010/0079144 A1    Apr. 1, 2010

(30) Foreign Application Priority Data

Oct. 27, 2006  (AU) .................................. 2006905993
Jun. 12, 2007  (AU) .................................. 2007903151

(51) Int. Cl.
*G01V 3/00*      (2006.01)
(52) U.S. Cl.
USPC .............................. 324/319; 324/320; 335/299
(58) Field of Classification Search .................. 324/319, 324/320; 335/299, 301
See application file for complete search history.

(56) References Cited

U.S. PATENT DOCUMENTS 5,245,306 A * 9/1993 Overweg ....................... 335/299
5,343,182 A * 8/1994 Ohta ............................. 335/299
5,359,310 A * 10/1994 Pissanetzky .................. 335/301

(Continued)

OTHER PUBLICATIONS

Crozier et al., "The Stochastic Design of Force-Minimized Compact Magnets for High-Field Magnetic Resonance Imaging Applications," *IEEE Trans. Appl. Supercond.*, 11(2): 4014-4022 (2001).

(Continued)

*Primary Examiner* — Louis Arana
(74) *Attorney, Agent, or Firm* — Finnegan, Henderson, Farabow, Garrett & Dunner, LLP (57) ABSTRACT

A magnetic resonance system uses a shielded superconducting magnet to produce a dsv useful for specialist imaging in an overall short magnet system at field strengths 1.5 Tesla and above. The magnet includes at least a first central coil C1, which has a length of at least 25% of the overall length of the magnet, and is used in concert with a series of symmetric primary coils, at least one set of which carry current in a direction opposite to that of the central coil. Force balancing is advantageously used in the design of the coils. The primary coils are shielded by at least one shielding coil, which carries current in a direction opposite to the majority of the primary coils. The magnet resonance system can be used for orthopedic imaging.

20 Claims, 11 Drawing Sheets

U.S. PATENT DOCUMENTS

| | | |
|---|---|---|
| 5,396,207 A | 3/1995 | Dorri et al. |
| 5,416,415 A | 5/1995 | Dorri et al. |
| 5,646,532 A | 7/1997 | Knüttel et al. |
| 5,801,609 A | 9/1998 | Laskaris et al. |
| 5,818,319 A | 10/1998 | Crozier et al. |
| 6,140,900 A | 10/2000 | Crozier et al. |
| 6,479,999 B1 | 11/2002 | DeMeester et al. |
| 6,700,468 B2 | 3/2004 | Crozier et al. |
| 7,212,004 B2 * | 5/2007 | Doddrell et al. .............. 324/319 |
| 7,579,838 B2 * | 8/2009 | Hollis ........................... 324/320 |

OTHER PUBLICATIONS

Haacke et al., "Magnetic Resonance Imaging: Physical Principles and Sequence Design," John Wiley & Sons, Inc., New York, 1999, pp. 830-841.

Lawrence et al., "A Computationally Efficient Feasible Sequential Quadratic Programming Algorithm," *SIAM J. Optim.*, 11(4): 1092-1118 (2001).

International Search Report for PCT/AU2007/001647, mailed Dec. 12, 2007 (2 pages).

* cited by examiner

MAGNETS FOR USE IN MAGNETIC RESONANCE IMAGING

I. FIELD OF THE INVENTION

The present invention relates to short, shielded superconducting magnets for producing substantially homogeneous magnetic fields ($B_0$ fields) for use in magnetic resonance imaging applications. The magnets are particularly well-suited for use in specialist magnetic resonance imaging, and especially for use in producing images of extremity joints of a subject, e.g., a subject's knee, ankle or wrist.

II. BACKGROUND OF THE INVENTION

Magnetic Resonance Imaging (MRI) was introduced in the 1980s, and has developed into a major global imaging modality with current sales of approximately 3,000 scanners worldwide per annum.

Clinical MRI depends for its success on the generation of strong and pure magnetic fields. A major specification of the static field in MRI is that it has to be substantially homogeneous over a predetermined region, known in the art as the "diameter spherical imaging volume" or "dsv." Errors or variation of less than 20 parts per million peak-to-peak (or 10 parts per million rms) are typically required for the dsv.

MRI equipment has undergone a number of refinements since the introduction of the first closed cylindrical systems. In particular, improvements have occurred in quality/resolution of images through improved signal to noise ratios and introduction of high and ultra high field magnets. Improved resolution of images, in turn, has led to MRI being a modality of choice for an increasing number of specialists for both structural anatomical and functional human MRI imaging.

The basic components of a typical magnetic resonance system for producing diagnostic images for human studies include a main magnet (usually a superconducting magnet which produces the substantially homogeneous magnetic field (the $B_0$ field) in the dsv), one or more sets of shim coils, a set of gradient coils, and one or more RF coils. Discussions of MRI, can be found in, for example, Haacke et al., *Magnetic Resonance Imaging: Physical Principles and Sequence Design*, John Wiley & Sons, Inc., New York, 1999. See also Crozier et al., U.S. Pat. No. 5,818,319, Crozier et al., U.S. Pat. No. 6,140,900, Crozier et al., U.S. Pat. No. 6,700,468, Dorri et al., U.S. Pat. No. 5,396,207, Dorri et al., U.S. Pat. No. 5,416,415, Knuttel et al., U.S. Pat. No. 5,646,532, and Laskaris et al., U.S. Pat. No. 5,801,609, the contents of which are incorporated herein in their entireties.

Conventional medical MRI magnets, including cryostat and covers, are typically around 1.6-2.0 meters in length with free bore diameters in the range of 0.8-1.0 meters. Normally, the magnet is symmetric, and the midpoint of the dsv is located at the geometric center of the magnet's structure. The uniformity of the axial component of the magnetic field in the dsv is often analyzed by a spherical harmonic expansion.

The typical aperture available to accommodate a patient in a conventional MRI machine (i.e. inside the gradients and RF transmitter coil) is a cylindrical space having a diameter of about 0.6-0.8 meters, i.e., just large enough to accept the subject's shoulders, and a length of about 2.0 meters or more. The dsv for such systems is located near the center of the aperture, which means that it is typically about a meter from the end of the aperture.

Not surprisingly, many people suffer from claustrophobia when placed in such a space. Although there have been improvements in patient comfort through the introduction of open systems in the early 1990s, and short bore high field closed systems in the early 2000s, there is still a distinct need for smaller magnetic resonance systems in modern medical imaging.

In addition to its effects on the subject, the size of the magnet is a primary factor in determining the cost of an MRI machine, as well as the costs involved in the siting of such a machine. Standard 1.5 T MRI whole body scanners, due to their size, weight, fringe field and power needs, demand highly specialised and expensive infrastructure before they can be installed, including development of separate multi-room imaging suites. These requirements mean that in most cases, only larger hospitals or substantial imaging clinics can afford to install such systems and offer MRI as a diagnostic modality to patients.

In order to be used safely, MRI machines often need to be shielded so that the magnetic fields surrounding the machine at the location of the operator are below regulatory agency-specified exposure levels. By means of shielding, the operator can be safely sited much closer to the magnet than in an unshielded system. Longer magnets require more shielding and larger shielded rooms for such safe usage, thus leading to higher costs.

Extremity MRI (which, for the purposes of this application, is also called orthopedic MRI) is one of the growth areas of the MRI industry, with 20% of all MRI procedures in the United States in 2006 being performed on upper extremities (e.g., arms, wrists, and elbows) and lower extremities (e.g., legs, ankles, and knees) (IMV, 2007). This equates to 5.3 million extremity procedures in 2006, compared with around 110,000 in 1990, when extremity scans made up only 2% of total MRI procedures.

Extremity MRI systems are much smaller than whole-body or conventional MRI systems and are much easier to site, due both to their reduced size and reduced stray fields. They are therefore a low cost solution to the imaging of extremities. As discussed below, extremity imaging is a particularly preferred application for the magnets of the present invention.

While extremity MRI systems have a number of advantages to the subject and the operator, they represent a challenge in terms of the space available for the various coils making up the magnet and in terms of cooling those superconducting coils. A major difficulty in realizing a superconducting magnet is to produce a large imaging dsv (of the required homogeneity) when the magnet length is reduced, while ensuring the superconducting wires can be used safety and efficiently.

Open systems, which comprise the larger portion of dedicated extremity systems, are constrained by being limited to lower field strengths; the highest field open MRI scanner on the market in 2005 was the Philips 1.0 T system.

The low field nature of the current smaller MRI systems on offer is a major disadvantage to their use. According to the American College of Rheumatology, 'the low-field MRI systems are unable to obtain the SNR of high-field MRI systems for images of similar spatial resolution'. Low field systems generally have longer image acquisition times, which can be problematic for procedures requiring contrast agents, since for extremity procedures, intravenously injected contrast agents can diffuse into the joint fluid in a period of minutes.

The present invention is directed to providing improved magnets and magnetic resonance systems which address these and other challenges of extremity MRI systems.

IV. SUMMARY OF THE INVENTION

The present invention provides a magnetic resonance system for producing MR images, and a magnet for use in the magnetic resonance system.

The magnet is of sufficient strength to produce a magnetic field of at least 1.5 tesla, which is substantially homogeneous over a predetermined imaging region (also called the "homogeneous region"). Preferably, the minimum cross-sectional dimension of the imaging or homogeneous region is designed to be greater than 15 cm, i.e. the calculated dimension.

The magnet comprises a primary coil structure having at least five primary coils positioned along an axis. One of the coils is a centre primary coil, i.e. positioned at or near the midway point along the axial length of the primary coil structure.

The magnet has an axial length (i.e. the axial extent of the coils) less than 70 cm, and preferably less than 60 cm. The centre primary coil extends axially greater than 25% of the axial length of the magnet, and preferably between 30% and 45% of the axial length of the magnet.

The primary coils which are second from the respective axial ends of the magnet are of opposite polarity to the centre primary coil.

The above described extremity magnet has the desirable characteristics of relatively strong field strength, small size and relatively large homogeneous dsv.

A shielding coil structure is preferably provided around the primary coil structure, and extends substantially the whole axial length of the magnet. The shielding coil structure has at least one shielding coil of greater diameter than the primary coils.

Preferably, force balancing is used in the design of the magnet to minimize the net forces on the coils, and in particular, the end coils in the primary coil structure, thereby substantially reducing the need for support former material external to the end coils. In implementing the step of force balancing, Maxwell forces are included in the error function to be minimized.

The magnet is particularly suitable for use in a magnetic resonance system for orthopaedic imaging.

The above summary of the of the invention and certain embodiments are only for the convenience of the reader and are not intended to and should not be interpreted as limiting the scope of the invention. More generally, it is to be understood that both the foregoing general description and the following detailed description are merely exemplary of the invention, and are intended to provide an overview or framework for understanding the nature and character of the invention as it is claimed.

Additional features and advantages of the invention are set forth in the detailed description which follows, and in part will be readily apparent to those skilled in the art from that description or recognized by practicing the invention as described herein. Both these additional aspects of the invention and those discussed above can be used separately or in any and all combinations.

The accompanying drawings are included to provide a further understanding of the invention, and are incorporated in and constitute a part of this specification. The drawings illustrate, by way of example, various embodiments of the invention, and together with the description serve to explain the principles and operation of the invention. In the drawings and the specification, like parts in related figures are identified by like numbers.

VI. DETAILED DESCRIPTION OF EMBODIMENTS OF THE INVENTION

As discussed above, the present invention relates to magnetic resonance systems which comprise relatively short superconducting magnets having symmetric structures and a particular coil arrangement on the primary structure. A superconducting magnet has a primary coil structure comprising an arrangement of coils. The primary coil structure is surrounded by a shielding coil structure or layer, also made up of an arrangement of one or more coils. The coils are illustrated schematically in the drawings.

Figure 1:
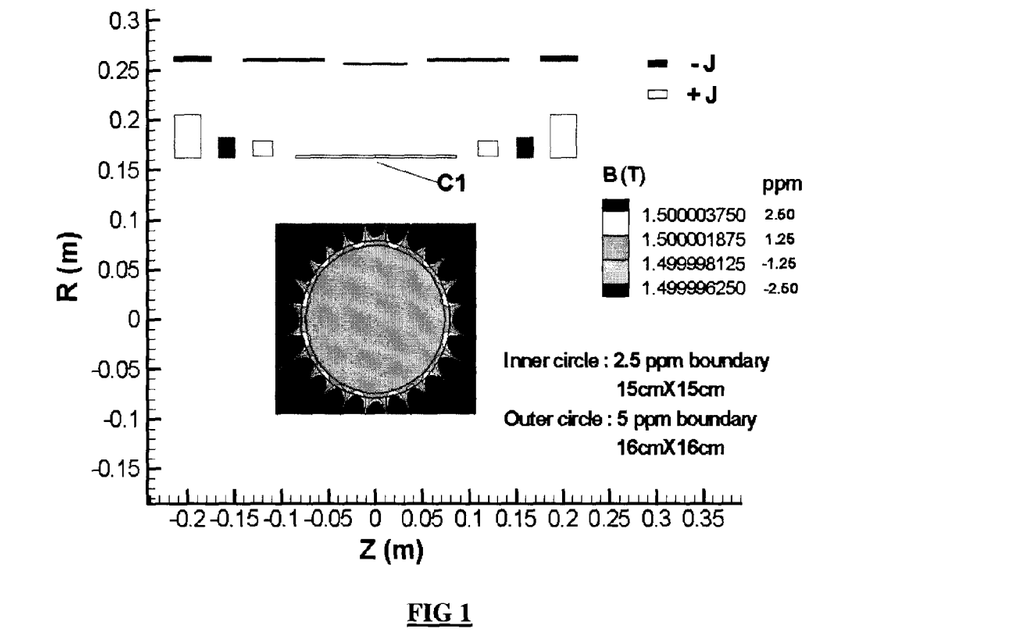
FIG. 1 shows schematically the coil configuration and dsv size of a magnet according to a first embodiment of the invention.
Figure 5:
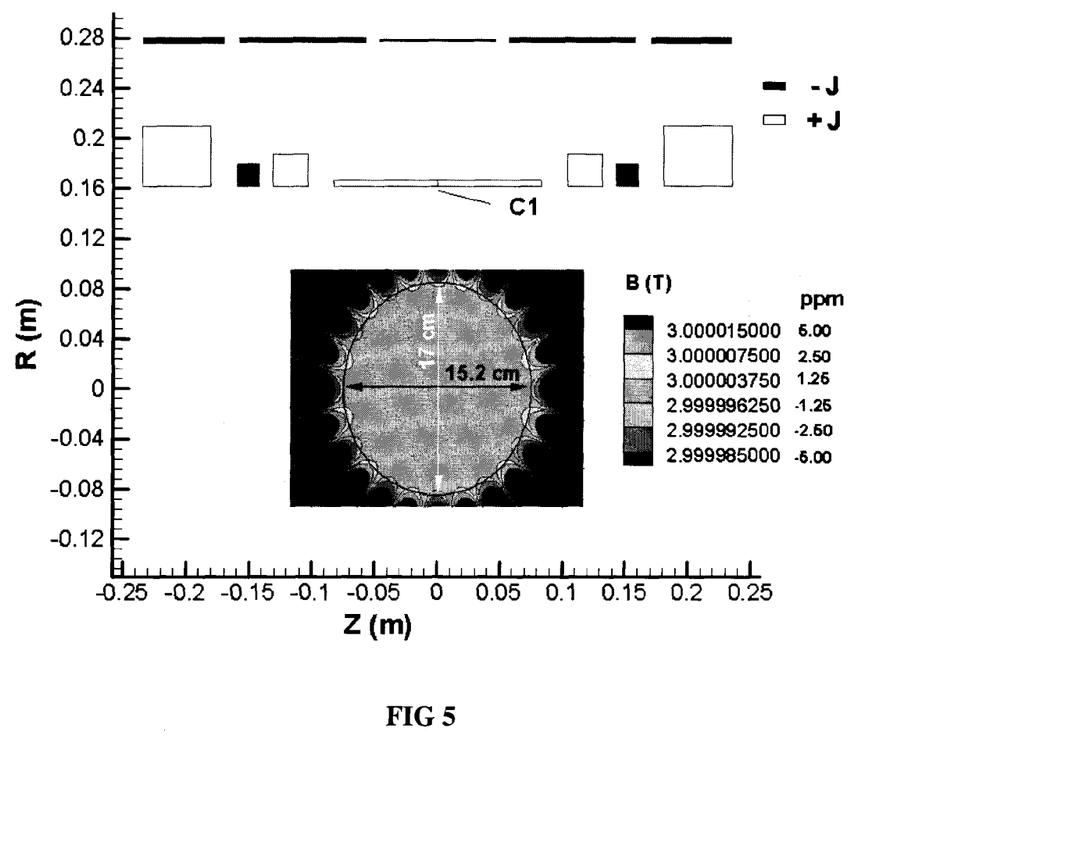
FIG. 5 shows schematically the coil configuration and dsv size of a magnet according to a second embodiment of the invention.

As illustrated in the embodiments of FIGS. 1 and 5, in the primary coil structure of the magnet, the central coil C1 is the longest coil in the assembly and all coils apart from the coil next to the end coil have the same polarity. The coil next to each end coil has reverse polarity to other primary coils, e.g. the coil is wound so that current flows in the reverse direction in this coil.

At the same time, the peak fields in the superconductors are constrained to reasonable values and this is an important practical aspect. If the peak fields are high, the superconductors are restricted in the current density that they can safety carry (or risk quenching—a process in which superconductivity is lost) and furthermore, when the peak fields are high, they require a larger percentage of superconductor filaments within the wire making it more expensive.

Although not wishing to be bound by any particular theory of operation, it is believed that this arrangement of coils allows the magnet to have to large an homogeneous dsv relative to the overall length of the coil assembly and at the same time having peak fields within the superconducting coils of suitable levels to produce safe and efficient magnets.

Instead of a single shielding coil, the shielding layer can include a plurality of separate coils, e.g., two coils or three coils separated over the length of the magnet system. Because the peak magnetic fields and therefore, to some extent, the stresses are controlled in the magnets of the invention, superconducting wires having reduced amounts of superconducting materials, e.g., niobium-titanium alloys, can be used.

In the preferred embodiments of the invention, the magnets achieve some and, most preferably, all of the following performance criteria:

(1) a smallest inner diameter of the coils less than or equal to 70 centimeters,
(2) an overall length of the coil set less than or equal to 60 centimeters,
(3) a level of dsv homogeneity and size sufficient for effective MR imaging (preferably, at a homogeneity level of less than 20 parts per million variation peak-to-peak relative to the value of $B_0$ at the dsv's midpoint M, the dsv has a volume ($V_{dsv}$) of at least 1400 cm$^3$ for a magnet having a cold bore volume $V_{bore}$ which is less than or equal to 50,000 cm$^3$, i.e., $V_{dsv}/V_{bore}$ ratio is greater than or equal to 0.028),
(4) sufficient spacing between coils to allow effective cryogenic cooling,
(5) low peak magnetic fields within the coils to allow for the use of less expensive superconducting wire (e.g., a calculated peak magnetic field within any of the plurality of current carrying coils whose magnitude less than approximately 7.5 Tesla), and
(6) low stray fields (e.g., a calculated stray magnetic field external to the magnet that is less than $5\times10^{-4}$ Tesla at all locations greater than 2 meters from the midpoint M of the dsv).

Examples of the magnets of the invention, and the procedures used in determining the coil configurations and turn distribution functions of the magnets, will now be more fully described.

Figure 4:
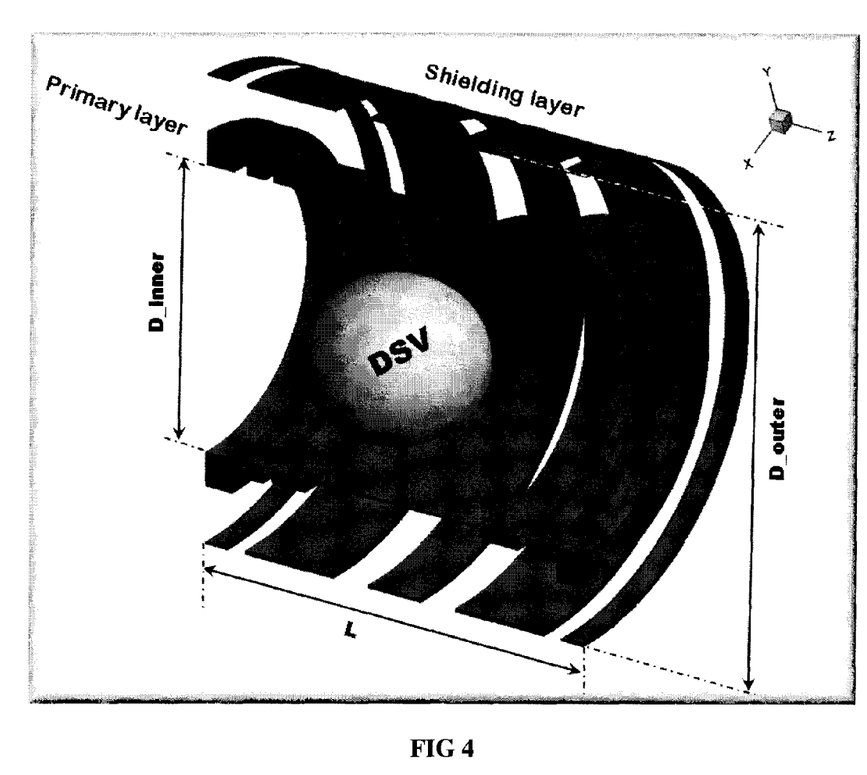
FIG. 4 shows in perspective the relative sizes of the coils and the DSV.

The coil positions were determined in an optimization process (see FIG. 4). The optimization was performed using a constrained numerical optimization technique based on a Sequential Quadratic Programming (SQP) scheme (Lawrence C. T., and Tits A. L., A Computationally Efficient Feasible Sequential Quadratic Programming Algorithm, *SIAM Journal on Optimization*, 11(4):1092-1118, 2001). The routine used the geometry and positions of the field generating elements as parameters and the error terms mentioned above to calculate the final coil geometry for the magnet.

The contents of the above Lawrence et al. reference is incorporated herein in its entirety.

EXAMPLE 1

1.5 T Magnet

This example, shown schematically in FIG. 1, illustrates a superconducting magnet of the present invention. In broad overview, the magnet employs twelve coils and has a cold bore length and a cold bore inner radius of approximately 0.43 and 0.165 meters, respectively. On the primary windings of the magnet, all of the coils are wound in the same direction (i.e. have the same polarity) apart from the coils second from the ends, i.e. those two coils approximately centered at 0.16 m from the centre. These coils are wound in the opposite direction to all others on the primary (i.e. have reverse polarity).

The central coil on the primary winding (i.e. that coil spanning the z=0 position, denoted C1) is longer than the others (and comprises approximately 38% of the total magnet length). This feature, when combined with the topology of the other coils, results in improved homogeneity compared to other coil configurations for a magnet of the same overall length. There are a total of five shielding coils in the shielding coil structure of the magnet, and they extend variously along the length of the magnet, including one shielding coil surrounded the z=0 axis.

Figure 2:
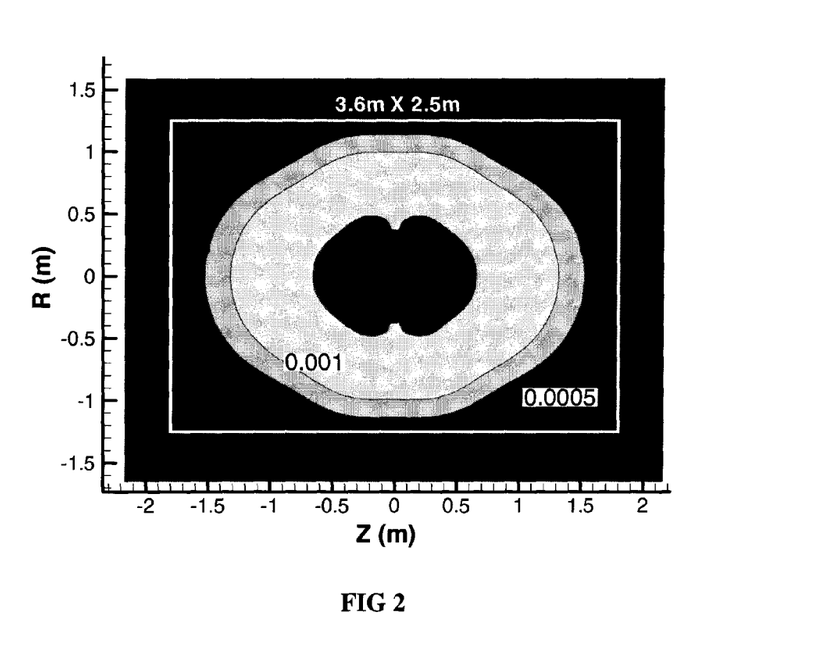
FIG. 2 shows the stray field outside the magnet, and particularly the 5 gauss ($5 \times 10^{-4}$ Tesla) contours, for the embodiment of FIG. 1.
Figure 3:
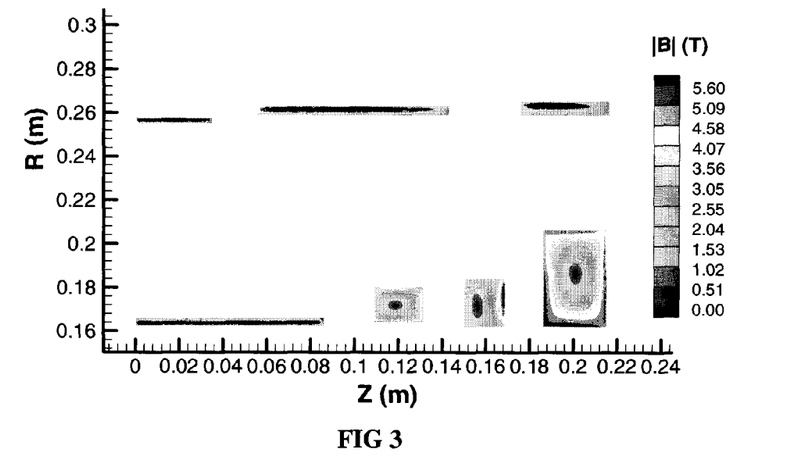
FIG. 3 is a plot showing calculated magnitudes of the total magnetic field within the coils of one-half of the magnet of the embodiment of FIG. 1. The strengths of the fields are shown by the gray scales set forth in the figures.

FIG. 1 shows the magnet and the field within the dsv. FIG. 2 shows the calculated stray external fields and axial magnetic field generated by the magnet. FIG. 3 shows the calculated magnitudes of the total magnetic field generated by the magnet within the magnet's various coils. Note in FIG. 1, the polarities of the current density in each coil are indicated.

As shown in FIG. 1, the magnet has a dsv which is approximately spherical with a diameter of approximately 16 centimeters, which is a substantial proportion of the total length of the magnet. The magnet also has a 5 Gauss line which is within about 2 meters of the center of the dsv, being approximately 1.8 m axially and 1.2 m radially (shown in FIG. 2).

As shown in FIG. 3, the peak calculated magnetic field is less than 5.6 Tesla, which allows the magnet to be constructed using readily available superconducting wire.

FIG. 4 shows in perspective the relative sizes of the coils and the DSV, indicating a large DSV compared to the total magnet length and this enabling the imaging of knees, for example, with the patient comfortably sitting on a chair with most of their body outside the magnet.

The magnet of this example is particularly well-suited for use in orthopedic imaging of such joints as the knee, ankle, wrist, and elbow.

Example 2

3 T Magnet

This example, shown schematically in FIG. 5, illustrates a 3 T superconducting magnet design using a structure according to a second embodiment of the invention.

As shown in FIG. 5, the coil structure is less than 0.5 meter in total length while a homogeneous dsv is generated over an ellipse of major axis 17 cm and minor axis approximately 15 cm wherein the homogeneity of the dsv varies by less than +/−5 ppm over that volume. The magnet uses the same topology as that in example 1, where the coils next to the end coil on the primary are of opposite polarity to all others in the primary coil set. The middle coil in this example extends approximately 45% of the total length of the coil structure and this feature again provides the advantage when combined with the other features of producing a relatively large and useful imaging region.

Figure 6:
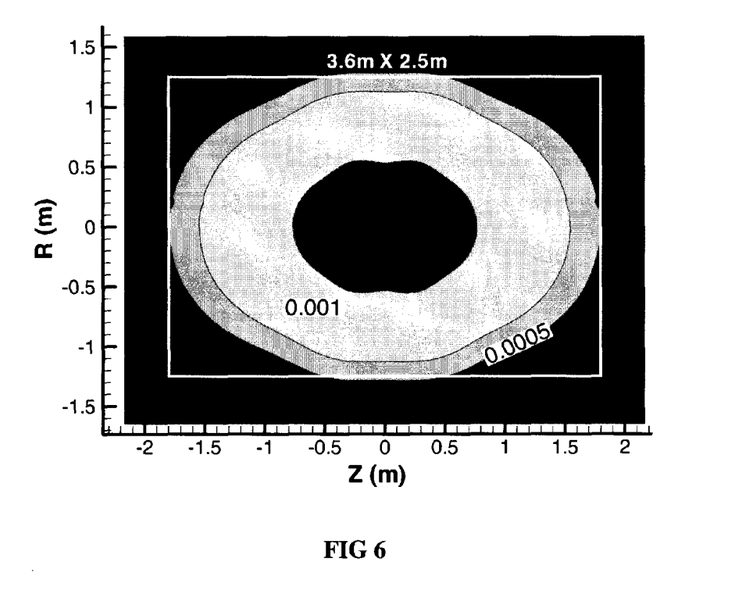
FIG. 6 shows the stray field outside the magnet, and particularly the 5 gauss ($5 \times 10^{-4}$ Tesla) contours, for the embodiment of FIG. 5.
Figure 7:
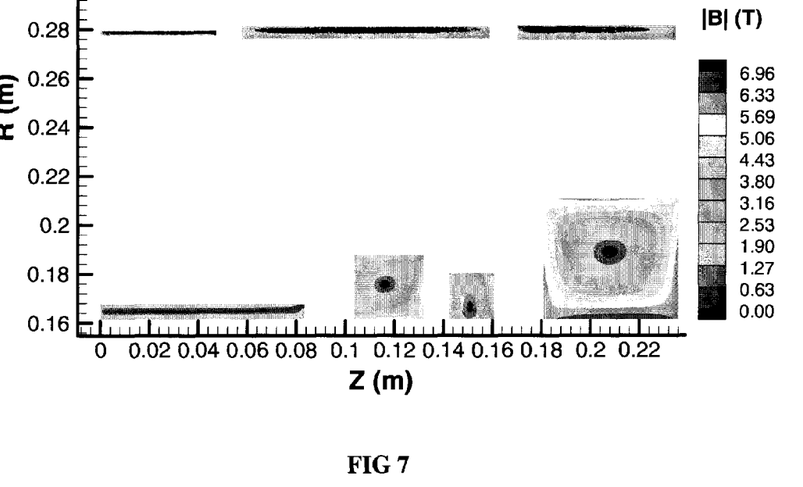
FIG. 7 is a plot showing calculated magnitudes of the total magnetic field within the coils of one-half of the magnet of the embodiment of FIG. 5. The strengths of the fields are shown by the gray scales set forth in the figures.

The stray fields in this magnet are well controlled, being approximately 1.8 m and 1.25 m in the axial and radial directions respectively as is shown in FIG. 6. The fields in the conductors shown in FIG. 7 are higher than in example 1, as expected due to the doubling of the field strength, but are still within capabilities of available superconducting wires.

As with the magnet of Example 1, the magnet of this example is well-suited for orthopedic and similar applications, now at the higher field strength of three Tesla demonstrating the broad applicability of the proposed structure.

For comparative purposes, the effect of changing the length of the central coil and re-optimizing the magnet with other aspects of the invention remaining the same is described below. Simulations of both 1.5 T systems (FIGS. 8 and 9) and 3 T systems (FIGS. 10 and 11) are considered.

Figure 8:
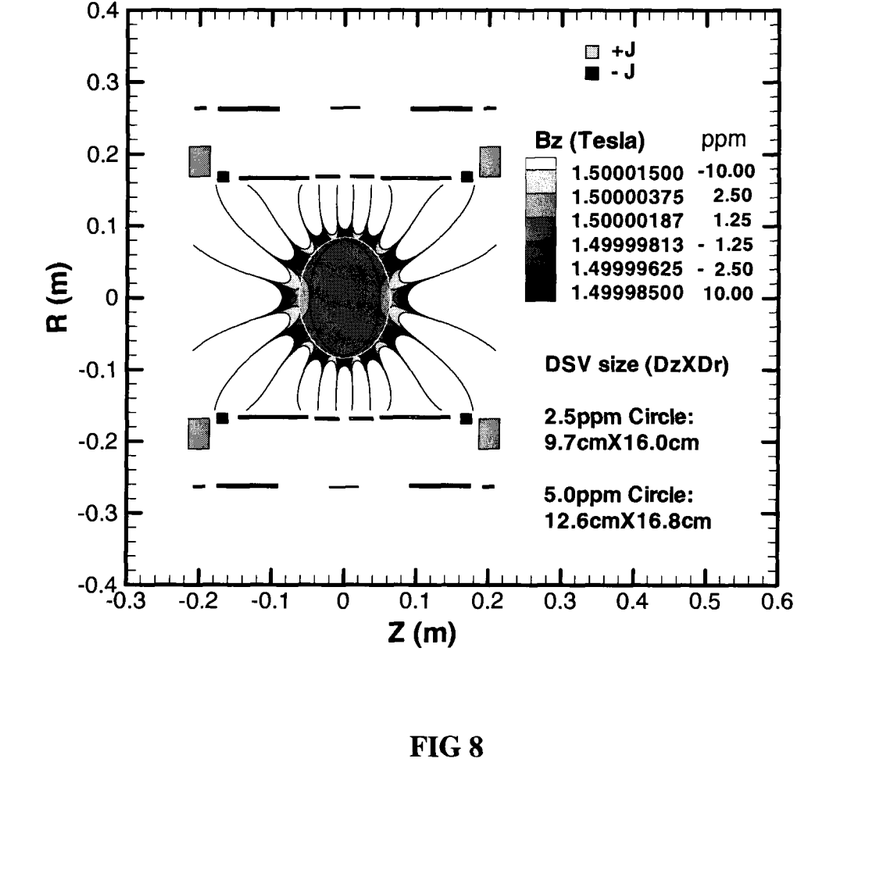
FIG. 8 shows schematically the coil configuration and dsv size of a 1.5 T magnet with short centre coil.
Figure 9:
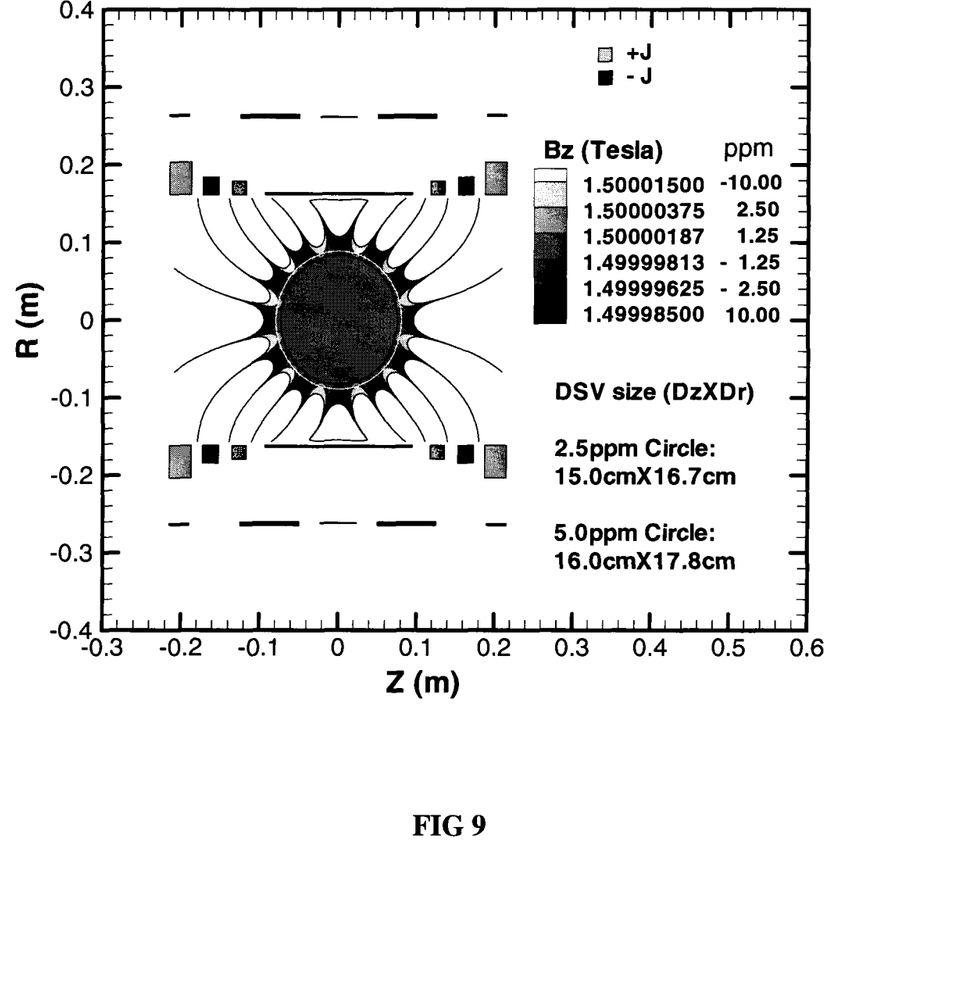
FIG. 9 shows schematically the coil configuration and dsv size of a 1.5 T magnet with long centre coil.

In FIG. 8, a 1.5T magnet with the coil closest to z=0 being approximately 15% of the total magnet length is optimized and resulted in an axial dsv size of 12.6 cm (at 5 ppm homogeneity). By extending the central coil to 43% of the total magnet length and re-optimizing as is shown in FIG. 9, the dsv is significantly and beneficially extended in the axial direction to 16 cm (at 5 pmm homogeneity).

Figure 10:
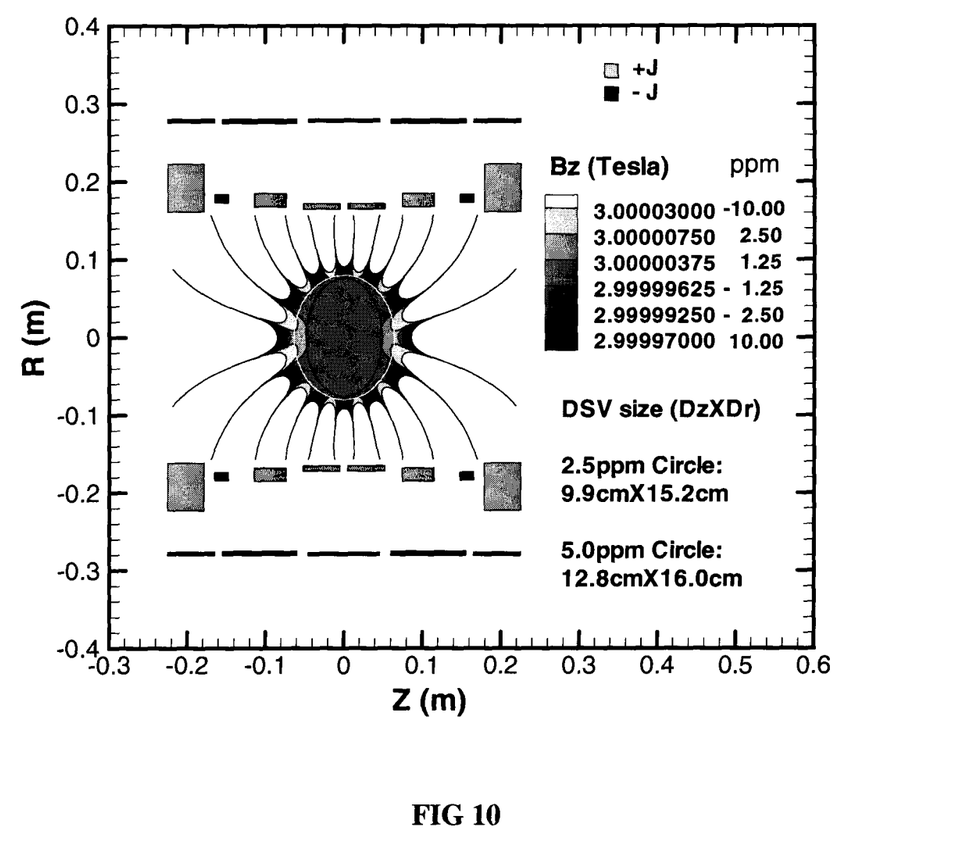
FIG. 10 shows schematically the coil configuration and dsv size of a 3 T magnet with short centre coil.
Figure 11:
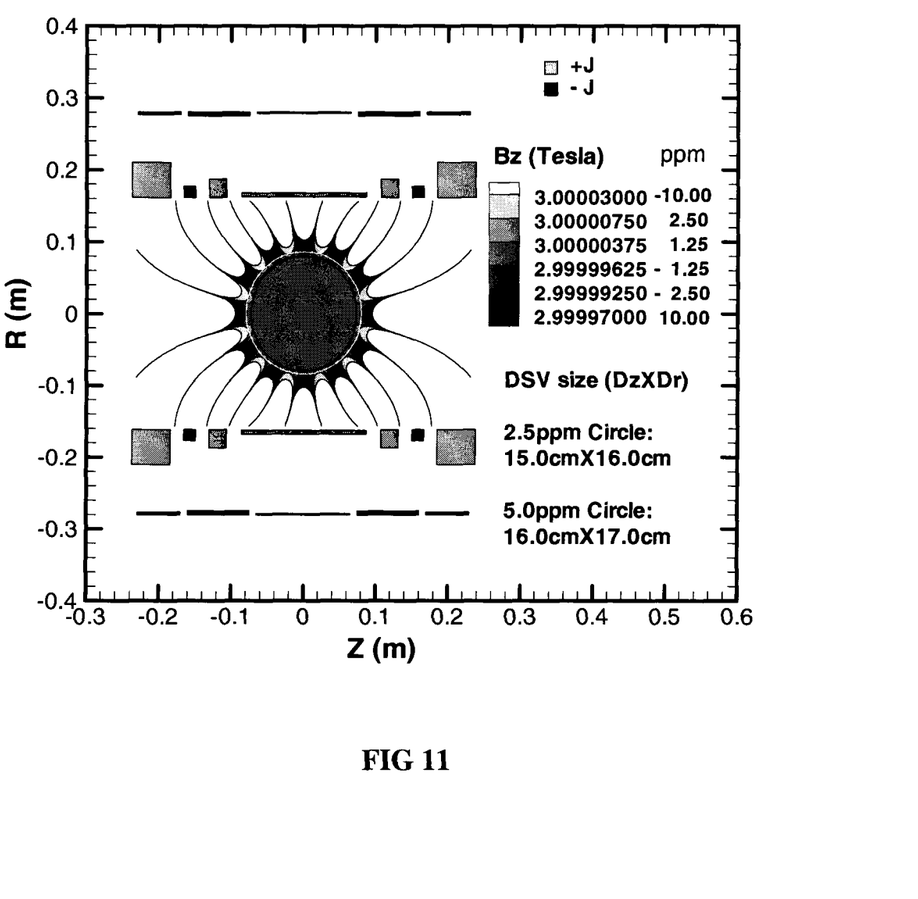
FIG. 11 shows schematically the coil configuration and dsv size of a 3 T magnet with long centre coil.
Figure 12:
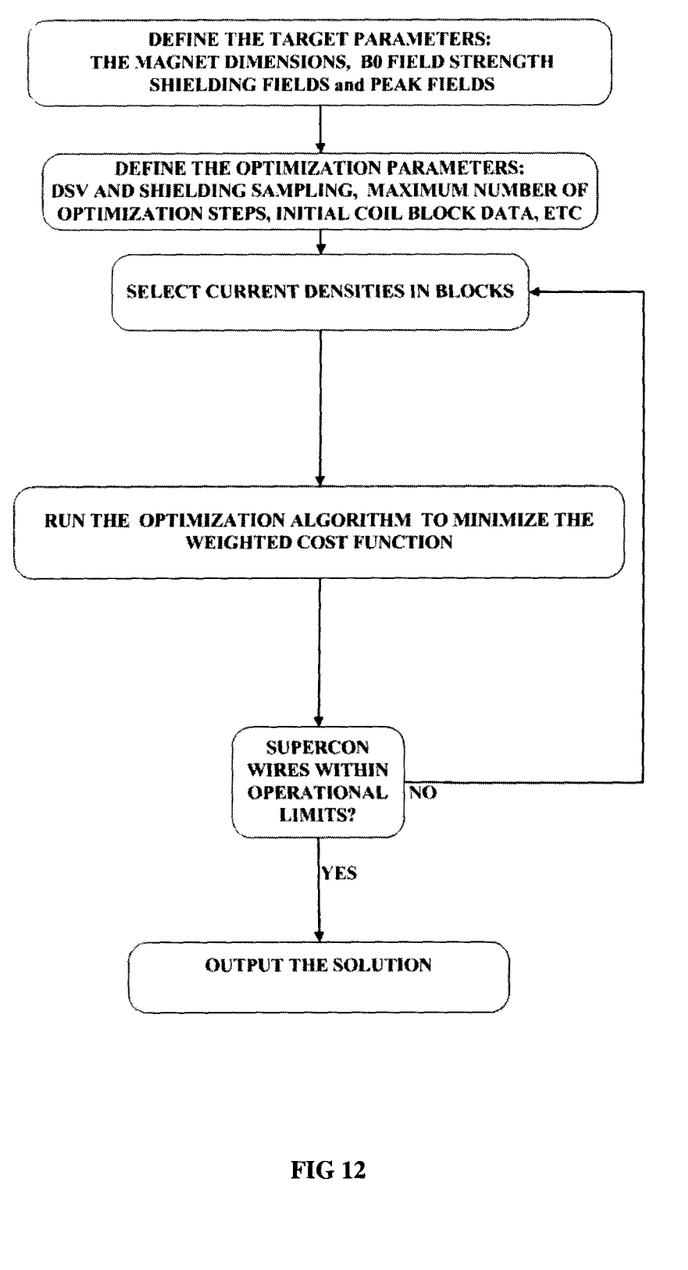
FIG. 12 shows a flowchart describing the design process.

Similar results for the 3 T case are shown in FIGS. 10 and 11 where a shorter central coil of 20% magnet total length resulted in a dsv which extends only 12.8 cm (at 5 ppm homogeneity), while the example with a long central coil at 36% of the total magnet length resulted in an extended dsv of axial length 16 cm (at 5 ppm homogeneity).

This clearly demonstrates the advantage of the coil structure of the invention at both field strengths, particularly where long central coils are used. The increased dsv size relative to the total length of the magnet is of distinct benefit for extremity imaging.

In a further embodiment of the invention, force balancing is included so as to minimize the net forces on all of the coils in the magnet with specific attention being paid to the outermost coil on the primary.

As the magnet system is compact, the coils are necessarily in close proximity, and the magnetic forces that act on the superconducting windings can be very large. These forces can cause the superconducting alloys to perform below their rated properties or even to quench and cease superconducting. The consideration of magnetic forces in the design process is very important for such a system and therefore in this embodiment automated force reduction is included in the design process.

With regard to each outermost or end coil in the primary, if the net force on this coil can be made small and/or inwardly directed, the axial mechanical support required for this coil is reduced and only a small supporting structure is required outside the coil along the Z-axis. This reduces the space requirements in the axial direction and permits further compactness of the magnet. In some cases, no axial is support is needed axially outward from the coil.

In implementing the step of force balancing, Maxwell forces are included in the error function to be minimized. This is achieved by breaking each coil block into small elements, calculating the peak field components in each element, calculating the mathematical cross-product of the current density and the field which equals the force vector, summing the z-component of the force vectors over all the small elements for each block to arrive at a net z-force for each block, and then attempting to control or specify, or otherwise utilizing, said net forces in the design (optimization) process.

A preferred objective of this process is to minimize the net z-force in the outermost primary coil and, if not zero, to ensure the net force is directly slightly inward, thus substantially reducing the need for support former material external to this coil along the z-axis.

Force balancing permits an automated force reduction in the magnet designs while controlling the overall dimensions of the system [More details can be found in Crozier S., Snape-Jenkinson C. J., Forbes L. K., The stochastic design of force-minimized compact magnets for high-field magnetic resonance imaging applications, *IEEE Trans. Appl. Supercond.*, Vol. 11, No. 2, pp.: 4014-4022, 2001, the disclosure of which is incorporated herein by reference].

Figure 13:
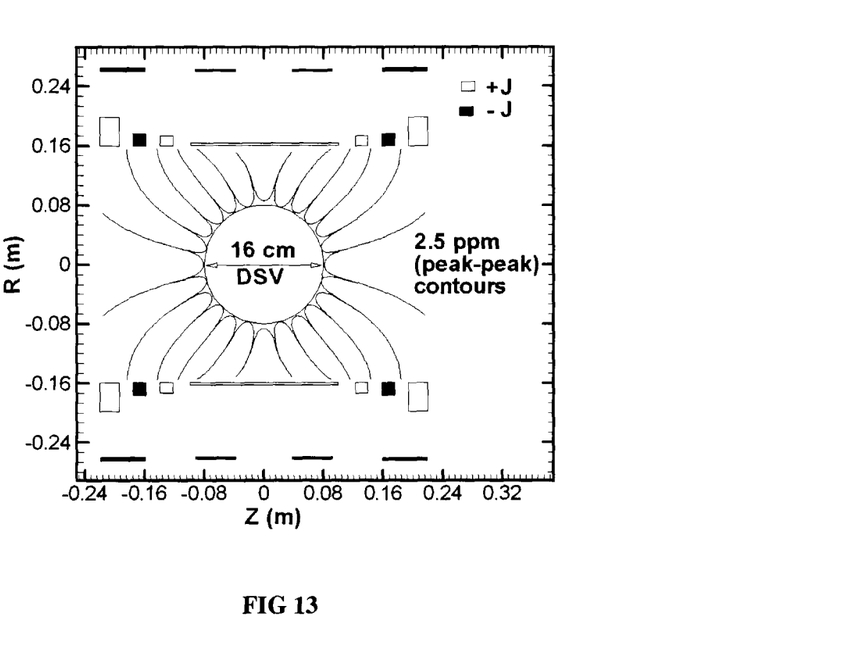
FIG. 13 shows a 1.5 T magnet design without force constraint.
Figure 14:
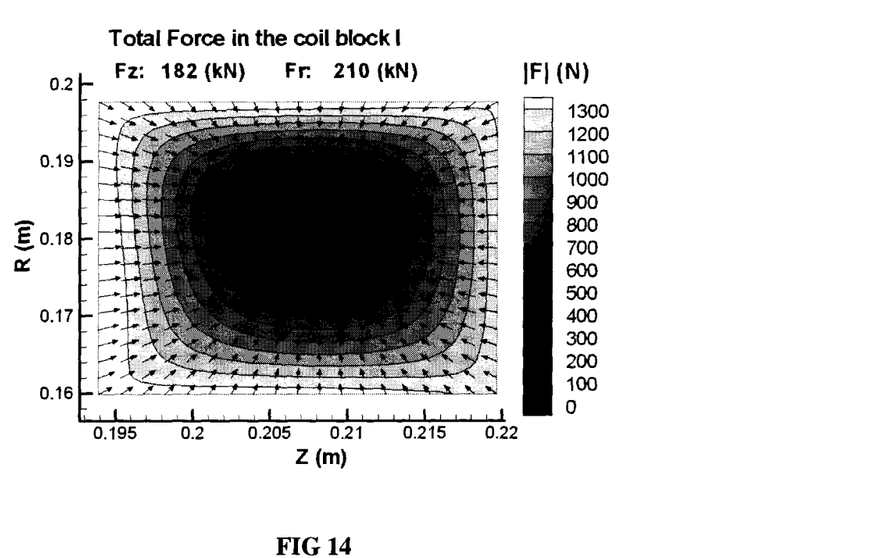
FIG. 14 shows the force profile of the outermost primary coil of the magnet of FIG. 13.
Figure 15:
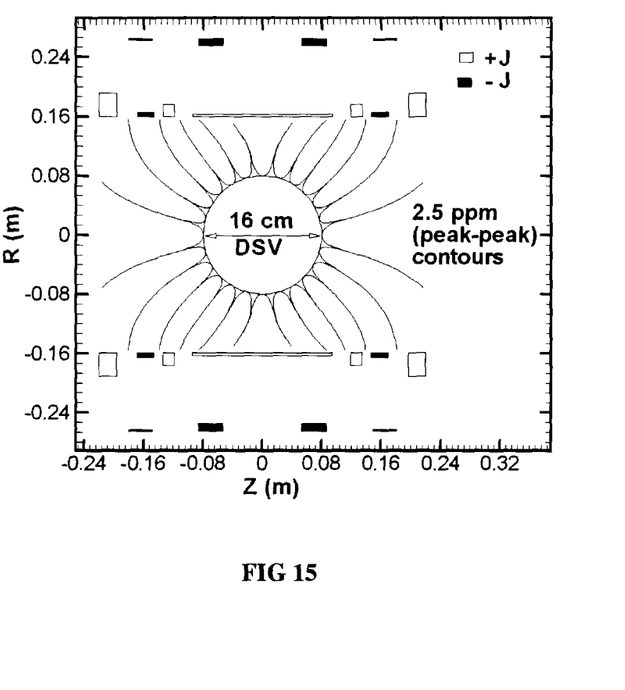
FIG. 15 shows a 1.5 T magnet design with force constraint.
Figure 16:
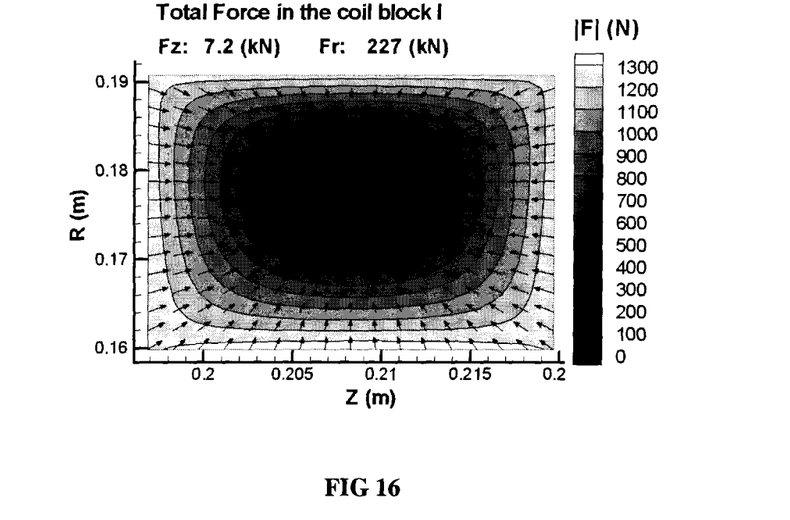
FIG. 16 shows the force profile of the outermost primary coil of the magnet of FIG. 15.

A 1.5 T orthopaedic MRI magnet was designed in which force reduction was invoked. The magnet is calculated to generate a full 16-cm diameter homogeneous region with 2.5 ppm (peak to peak), as shown in FIGS. 15 and 16. Compared with a design without force control shown in FIGS. 13 and 14, there are apparent differences in the coil patterns: the reversed coils close to the end coil block in the primary coil structure tend to be positioned further away from the end coil; and there are other changes in the coil profile. This design provides a much smaller net, compressive force component in the z-direction, 7.3 kN as compared to 182 kN in the unconstrained design, a reduction factor of approximately 25. This improves the safety of the design and reduces the support requirements for the primary coil set in the axial direction.

The foregoing embodiments are intended to be illustrative of the invention, without limiting the scope thereof. The invention is capable of being practised with various modifications and additions as will readily occur to those skilled in the art.

Accordingly, it is to be understood that the scope of the invention is not to be limited to the exact construction and operation described and illustrated, but only by the following claims.

The invention claimed is:

1. A magnet, suitable for use in a magnetic resonance system comprising:
   a primary coil structure having at least five primary coils positioned along an axis of the magnet, wherein the five primary coils include a centre primary coil and further include primary coils which are second from respective axial ends of the magnet and are of opposite polarity compared to the centre primary coil, and wherein the centre primary coil consists essentially of a single coil; and
   a shielding coil structure having at least one shielding coil for reducing stray fields outside the magnet, wherein the shielding coil structure is of a greater diameter than the primary coil structure and extends substantially an entire axial length of the magnet.

2. A magnet as claimed in claim 1, wherein the axial length of the magnet is less than 60 cm.

3. A magnet as claimed in claim 1, wherein force balancing is used in the design of the magnet.

4. A magnetic resonance imaging system having a magnet as claimed in claim 1.

5. A magnet as claimed in claim 1, wherein the magnet is for producing a magnetic field which has a density of at least 1.5 tesla and is substantially homogeneous over a predetermined imaging volume.

6. A magnet as claimed in claim 5, wherein the centre primary coil extends axially between 30% and 45% of the axial length of the magnet.

7. A magnet as claimed in claim 6, wherein a minimum cross-sectional dimension of the predetermined imaging volume is designed to be greater than 15 cm.

8. A magnet as claimed in claim 6, wherein the axial length of the magnet is less than 60 cm.

9. A magnet as claimed in claim 5, wherein a minimum cross-sectional dimension of the predetermined imaging volume is designed to be greater than 15 cm.

10. A magnet as claimed in claim 9, wherein the axial length of the magnet is less than 60 cm.

11. A magnet as claimed in claim 1, wherein the magnet is of tubular form and has a compact diameter to permit a patient to insert a limb under study into the magnet.

12. A magnet as claimed in claim 1, wherein the axial length of the magnet is less than 70 cm and an axial length of the centre primary coil is greater than 25% of the axial length of the magnet.

13. A method of designing a magnet for a magnetic resonance system, the method comprising:
provide a primary coil structure having at least five primary coils positioned along an axis of the magnet, wherein the five primary coils include a centre primary coil and further include primary coils which are second from respective axial ends of the magnet and are of opposite polarity compared to the centre primary coil, and wherein the centre primary coil consists essentially of a single coil;
providing a shielding structure having at least one shielding coil for reducing stray fields outside the magnet, wherein the shielding coil structure is of a greater diameter than the primary coil structure and extends substantially an entire axial length of the magnet; and
force balancing to minimize net forces on at least end coils in the primary coil structure.

14. A method as claimed in claim 13, wherein the force balancing comprises including Maxwell forces in an error function to be minimized.

15. A method as claimed in claim 13, wherein the force balancing comprises:
dividing each coil block into small elements,
calculating the peak magnetic field components in each element,
calculating the force vector for each element from the mathematical cross-product of the current density in the element and the magnetic field,
summing the z-component of the calculated force vectors over all the small elements for each block to determine a net z-force for each block, and
utilising said net forces in a design optimization process.

16. A method as claimed in claim 13, wherein the magnet is for producing a magnetic field which has a density of at least 1.5 tesla and is substantially homogeneous over a predetermined imaging volume.

17. A method as claimed in claim 16, wherein a minimum cross-sectional dimension of the predetermined imaging volume is designed to be greater than 15 cm.

18. A method as claimed in claim 13, wherein the axial length of the magnet is less than 60 cm.

19. A method as claimed in claim 13, wherein the magnet is of tubular form and has a compact diameter to permit a patient to insert a limb under study into the magnet.

20. A method as claimed in claim 13, wherein the axial length of the magnet is less than 70 cm and an axial length of the centre primary coil is greater than 25% of the axial length of the magnet.

* * * * *

UNITED STATES PATENT AND TRADEMARK OFFICE
CERTIFICATE OF CORRECTION

| | | |
|---|---|---|
| PATENT NO. | : 8,421,463 B2 | Page 1 of 1 |
| APPLICATION NO. | : 12/447070 | |
| DATED | : April 16, 2013 | |
| INVENTOR(S) | : Crozier et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 945 days.

Signed and Sealed this
Seventh Day of April, 2015

Michelle K. Lee
*Director of the United States Patent and Trademark Office*